(12) United States Patent
Smith et al.

(10) Patent No.: US 6,727,185 B1
(45) Date of Patent: Apr. 27, 2004

(54) DRY PROCESS FOR POST OXIDE ETCH RESIDUE REMOVAL

(75) Inventors: Patricia B. Smith, Colleyville, TX (US); Antonio L. P. Rotondaro, Dallas, TX (US); David B. Aldrich, Allen, TX (US); Eric C. Williams, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/679,800

(22) Filed: Oct. 5, 2000

Related U.S. Application Data

(60) Provisional application No. 60/167,789, filed on Nov. 29, 1999.

(51) Int. Cl.$^7$ .................. H01L 21/302; H01L 21/461
(52) U.S. Cl. .................. 438/727; 438/425; 438/906; 438/707
(58) Field of Search .................. 438/745, 704, 438/725, 906, 706, 707, 727

(56) References Cited

U.S. PATENT DOCUMENTS

| | | | | |
|---|---|---|---|---|
| 5,780,359 A | * | 7/1998 | Brown et al. | 438/659 |
| 5,824,604 A | * | 10/1998 | Bar-Gadda | 438/729 |
| 5,849,639 A | * | 12/1998 | Molloy et al. | 438/714 |
| 6,008,129 A | * | 12/1999 | Graff et al. | 438/700 |
| 6,080,680 A | * | 6/2000 | Lee et al. | 438/727 |
| 6,107,192 A | * | 8/2000 | Subrahmanyan et al. | 438/637 |
| 6,217,704 B1 | * | 4/2001 | Kitagawa | 156/345 |

* cited by examiner

Primary Examiner—Caridad Everhart
(74) Attorney, Agent, or Firm—Jacqueline J. Garner; W. James Brady, III; Frederick J. Telecky, Jr.

(57) ABSTRACT

A cleanup process that uses a dilute fluorine in oxygen chemistry in a downstream plasma tool to remove organic and inorganic polymeric residues (116).

18 Claims, 1 Drawing Sheet

DRY PROCESS FOR POST OXIDE ETCH RESIDUE REMOVAL

This application claims priority under 35 USC § 119(e)(1) of provisional application numbers 60/167,789 filed Nov. 29, 1999.

FIELD OF THE INVENTION

The invention is generally related to the field of post-etch residue removal in semiconductor fabrication and more specifically to a dry process for post-etch residue removal.

BACKGROUND OF THE INVENTION

In semiconductor fabrication, layers are routinely patterned with photoresist and subsequently etched to create patterned structures. One example is a via etch in which a via or hole is etched through an interlevel dielectric to an underlying metal interconnect layer. A photoresist stripping process is then used to remove the photoresist pattern. The etch and strip processes leave residue on the surface of the structure. A cleanup process is then required to remove the residue.

In optimizing a process for residue cleanup, four types of residues are distinguishable, and appear to require some changes in process parameters in order to most efficiently remove the residues. The first type of residue is referred to as "edge" residue. Edge residue is found around the perimeter of the wafer and is comprised of photoresist scum that is not exposed to the in situ ash process due to a wafer clamping mechanism. A second type of residue is referred to as "surface" residue. Surface residue is observable around vias and other patterned structures. The residue is unreactive with typical photoresist strip processes, and therefore remains after the strip process, whether or not the strip is in situ or ex situ with the dielectric etch process. The residue can be difficult to remove once it has been exposed to the ambient. A third type of residue is referred to as "feature" residue. Feature residue forms during the dielectric reactive ion etch (RIE) process and may cling to the sides of the feature or may accumulate at the bottom of the feature. For vias, when this type of residue is abundant, it can lead to a "stop etch" condition, in which the process conditions produce a polymer plug inside of the via rather than etching through the oxide interlevel dielectric layer. The fourth type of residue is referred to as a "field" residue. The field residue may be similar to the surface residue in quantity and composition. The field residue may differ from surface residue, because surface residue may incorporate more etch products due to its closer proximity to pattered areas compared with field locations. The residue may, therefore, be more difficult to remove for surface compared with field locations.

As device features of integrated circuits become smaller, currently used wet cleans become less effective in removing via or other feature residue. The fluid dynamics and surface tension properties of the liquids currently used limit their applicability to lower aspect ratio conditions compared with dry cleanup processes. Accordingly, an improved residue cleanup process is desired as aspect ratio requirements of the etch and cleanup move to more challenging feature sizes (larger aspect ratios).

SUMMARY OF THE INVENTION

The invention is a cleanup process that uses a dilute fluorine in oxygen chemistry in a downstream plasma tool to remove organic and inorganic polymeric residues. The cleanup process may remove undesired material and/or modify the exposed surface, thereby enhancing the desired properties of that surface.

An advantage of the invention is providing a cleanup process that offers simultaneous removal of both organic and inorganic residues using a dry (solvent-free) process.

This and other advantages will be apparent to those of ordinary skill in the art having reference to the specification in conjunction with the drawings.

DETAILED DESCRIPTION OF THE EMBODIMENTS

Figure 1A:
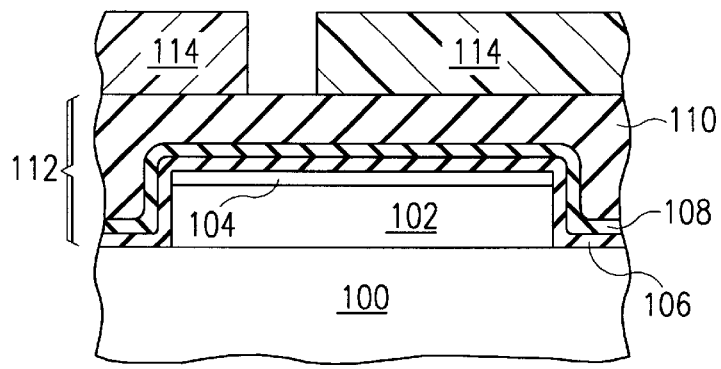
FIGS. 1A–1D are cross-sectional diagrams of a via cleaned according to the invention at various stages of fabrication.

The invention will now be described in conjunction with post-oxide etch residue cleanup process. However, the invention may be applied to other cleanup processes such as post-ion implantation cleanup, a pre-pattern cleanup, a post-fuse-etch cleanup, a scribe-seal cleanup or a bond-pad cleanup.

The invention uses a fluorine and oxygen chemistry in a tool having a downstream plasma source. A downstream plasma source is desirable in order to obtain chemical (completely isotropic) removal rather than a physical (anisotropic) removal. Ion bombardment, such as that which occurs during an RIE or HDP plasma etch, can cause charging damage to the wafer. Suitable downstream plasma tools are commercially available.

The plasma source of the invention allows for application to structures of varying aspect ratios. Whereas, prior art wet chemistries are limited by fluid dynamics and surface tension, plasma processes are not so limited. Thus, they may be scaled with advanced technologies, which continually require smaller features and higher aspect ratios. Furthermore, dry processes do not require the use and/or disposal of hazardous wet chemicals, and therefore can lead to lower processing costs.

Downstream plasma with a fluorine and oxygen chemistry allows simultaneous removal of both organic and inorganic polymeric residues with a high selectivity to oxides, nitrides and some low k dielectric materials. In addition, the fluorine and oxygen plasma process of the invention is capable of removing all four types of residue typically associated with post resist strip processing: edge, surface, feature, and field residue. In contrast, some prior art chemistries were not capable of removing surface or feature residue. In fact, it was previously believed that different chemistries were required to remove the different types of residue.

The frequency of the plasma source used in the invention is not critical. As an example, a radio-frequency (RF) source may be used. A typical RF frequency is 13.6 MHz. Other sources, such as a microwave frequency source (e.g., 2.45 GHz), or dual source tools (utilizing RF and microwave frequency plasma sources) will be apparent to those of ordinary skill in the art.

The invention uses a chemistry of less than 5% of a fluorine-containing gas in $O_2$. As the fluorine concentration in oxygen increases, control over the process selectivity decreases. For example, the process becomes more aggressive at pitting or removal of $SiO_2$ or HSQ for example, while reactivity with the polymeric residue may or may not improve. Accordingly, the fluorine source concentration should be kept below 5%. For most applications, the optimum fluorine source concentration will actually be below 1%, particularly if $C_2F_6$ is used for the fluorine source.

Various fluorine sources may be used. Examples include: $C_2F_6$, $CF_4$, $SF_6$, $NF_3$, and $CHF_3$. $SF_6$ and $NF_3$ are more aggressive sources due to the fact that the S-F and N-F bonds are easier to break than C-F bonds. $C_2F_6$ is more reactive with polymeric residues than $CF_4$. Moreover, $C_2F_6$ is more environmentally friendly than $CF_4$. Less ozone depletion occurs with $C_2F_6$ due to the presence of the C-C bond, which renders $C_2F_6$ more thermodynamically stable compared with $CF_4$.

The optimum concentration of fluorine mixed with oxygen depends on the fluorine source used and the desired aggressiveness for the clean. A preferred embodiment of the invention uses $C_2F_6$ at a concentration of less than 1%, preferably on the order of 0.2%. For $CF_4$, the preferred concentration is on the order of 2%. For $SF_6$ the preferred concentration is on the order of 1% or less and for $NF_3$ and $CHF_3$ the concentration is preferably less than 1%.

In the invention, oxygen is used to dilute the fluorine gas. Although not required, additional dilutants may be added. For example, helium, hydrogen, nitrogen and/or argon, or other gas sources containing these elements alone or in combination, may be added to further dilute the fluorine source.

Although a specific temperature range is not required to practice the invention, the temperature of the process may be used to tune the aggressiveness of the clean. Typically, the temperature will range between 25° C. and 350° C. As the temperature increases, the etching component of the clean is increased, selectivity of polymer to dielectric material (HSQ or SIO2, for example) decreases and the process generally becomes more aggressive. Pressure and power of the plasma are adjusted to maintain a stable processing regime and are typically about 1.0 Torr and 900 W (using a Mattson Technology, Inc. Aspen ICP tool, for example).

Application of the invention to a post oxide etch residue clean will now be described in conjunction with FIGS. 1A–1D. This example uses a via etch to illustrate the advantages of the invention and is not intended to limit the invention. Referring to FIG. 1A, semiconductor body 100 is processed through the formation of the interlevel dielectric (ILD) 112. Semiconductor body 100 is typically a silicon wafer having transistors and isolation structures (not shown) formed therein as is well known in the art.

Metal line 102 is formed over semiconductor body 100. Metal line 102 may be part of the first or any subsequent metal interconnect layer except the uppermost interconnect layer. In the preferred embodiment metal line 102 comprises aluminum (e.g., an aluminum-copper alloy). A barrier layer 104 is formed over metal line 102. In this example, barrier layer 104 comprises TiN to illustrate a particular advantage of the invention. Other suitable barriers are well known in the art.

In FIG. 1A, ILD 112 is shown as a multi-layer dielectric. Many suitable materials and combinations of materials are known in the art. In this example, ILD 112 comprises a first oxide layer 106, an HSQ (hydrogen silesquioxane) layer 108 and a second, thicker oxide layer 110. First oxide layer 106 may be formed using plasma enhanced tetraethoxysilane (PETEOS) deposition. Second oxide layer 106 may also be a TEOS layer.

A via pattern 114 is formed over oxide layer 110. Via pattern 114 is used to form a via or connection between two interconnect layers. Via pattern 114 comprises a photoresist material as is common in the art.

Figure 1B:
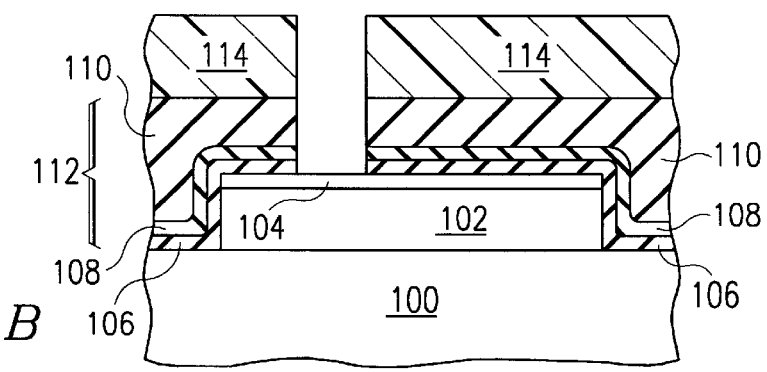

Referring to FIG. 1B, ILD 112 is etched using via pattern 114 as a mask. Methods for etching ILD 112 are known in the art. For example, a high density plasma tool, such as those available from Applied Materials, Inc. or Tokyo Electron Limited (TEL), may be used. This process generally produces a polymer "crust" layer on top of the photoresist layer as well as inside the walls of vias and other patterned structures.

Figure 1C:
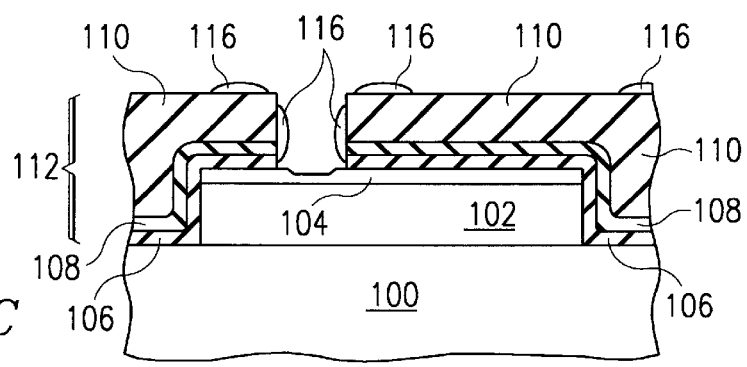

Next, via pattern 114 is removed using a photoresist strip (PR) step, as shown in FIG. 1C. Generally, an $O_2$ plasma tool is used for rapid photoresist removal. After the PR strip step, various organic and inorganic residues 116 remain on the structure. Residue 116 includes via residue, surface residue, and edge-of-wafer residue.

Figure 1D:
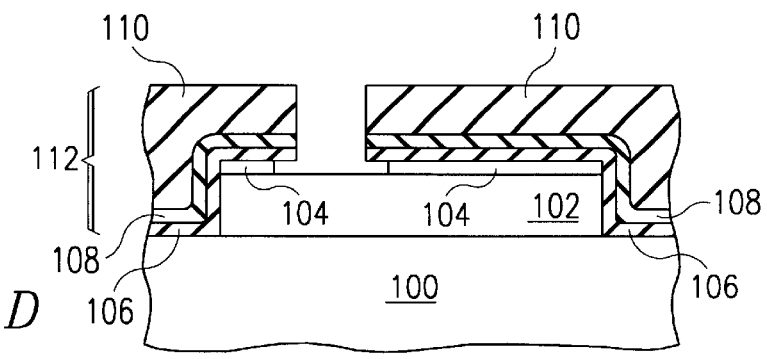

Residue 116 is removed using a fluorine and oxygen chemistry in a downstream plasma tool as described above. The result is shown in FIG. 1D. If $SF_6$ is used, the concentration should remain at or below 3% in oxygen. Above 3%, significant undercutting of the HSQ layer can result. HSQ undercut is also observable at above 3% $CF_4$ in $O_2$, and severe at a 7% $CF_4$ concentration. The preferred embodiment is dependent on the plasma equipment used. For a Mattson Technology, Inc. ICP source chamber, the preferred embodiment uses a 2% dilution of $CF_4$ in $O_2$, with a total gas flow of 3 liter/minute (lpm), at 700 millitorr (mT), 1200 W RF power, and 60° C. platen temperature for a duration of 60 seconds. For a Mattson ICP source chamber, the preferred embodiment uses a 0.15% dilution of $C_2F_6$ in $O_2$, with a total gas flow of 4 liter/minute (lpm), at 1.5 torr (T), 850 W RF power, and room temperature for a duration of 30 seconds.

This process can be altered to remove the TiN barrier layer 104 left at the bottom of the via. The fluorine concentration, temperature, pressure and flow rate can be varied to produce the desired undercut of the TiN barrier layer. If desired, the TiN barrier layer 104 may be undercut as shown in FIG. 1D to increase the interface area. This reduces the resistance. The invention allows for controllable TiN undercutting.

In order to remove particles, a spin/rinse ($H_2O$)/dry (SRD) process may follow the dry cleanup etch if desired.

The invention may be applied to other clean processes throughout the semiconductor fabrication process. Examples include contact clean, fuse clean, pre-pattern cleanup, scribe number clean, post-implant cleans, and re-work processing. The dry clean process described above for post via etch cleanup applies to virtually any post dielectric etch clean (e.g., contacts). Occasionally, residue may be left inside of the scribe numbers of an integrated circuit. The dry fluorine and oxygen clean of the invention may be used to remove the residue from the scribe numbers. Other example applications of the invention will now be described.

After the protective overcoat (PO) layer is deposited, fuse areas are opened up in some integrated circuits, such as SRAMs, to allow interconnect paths to be re-routed. The dry fluorine and oxygen plasma clean of the invention may also be applied to clean these fuse areas after they are opened. An exemplary fuse clean process may be carried out in a Mattson ICP strip tool using the four-step sequence of Table 1.

| Step | 1 | 2 | 3 | 4 |
|---|---|---|---|---|
| Pressure (T) | 6 | 0.8 | 1.1 | 6 |
| $C_2F_6$ (sccm) | 0 | 0 | 6 | 0 |
| $O_2$ (sccm) | 5000 | 500 | 3000 | 5000 |
| Power (W) | 0 | 950 | 950 | 0 |
| rf time (s.) | 0 | 3 | 120 | 0 |
| delay (s.) | 8 | 9 | 0 | 5 |
| temp. (C) | 250 | 250 | 250 | 250 |

When a deep ultra-violet (DUV) photoresist is used, the surface of the structure to be patterned must often be conditioned in order to improve adhesion of the photoresist to the surface. The dry clean process of the invention may also be applied to condition the surface of a structure before applying a DUV resist. An exemplary process sequence for conditioning the surface of a structure in a Mattson ICP strip tool is as follows:

1. Plasma Ignition Step:
   Time: 9 seconds idle+3 seconds plasma on
   Temp.: 250° C.
   Pressure: 0.8 torr
   Power: 950 W
   Gases: oxygen
   Gas Flow: $O_2$=500 sccm
2. Process Step:
   Time: 60 seconds
   Temp.: 250° C.
   Pressure: 1.1 torr
   Power: 950 W
   Gases: oxygen and hexafluorethane
   Gas Flow: $O_2$=3000 sccm, $C_2F_6$=6 sccm The invention may also be used at the post-implant strip step. After forming a pattern and implanting a dopant (e.g., for forming source and drain regions), the photoresist pattern may be removed using a dry fluorine and oxygen plasma process according to the invention. This sequence removes both a hardened crust layer, formed as a result of exposure of the resist to the implantation process, as well as the underlying photoresist. The following is an exemplary process in a Mattson ICP strip tool:

1. Plasma Ignition Step:
   Time: 9 seconds idle+3 seconds plasma on
   Temp.: room temperature
   Pressure: 0.5 torr
   Power: 975 W
   Gases: oxygen
   Gas Flow: $O_2$=400 sccm
2. Process Step 1:
   Time: 30 seconds
   Temp.: room temperature
   Pressure: 1.3 torr
   Power: 975 W
   Gases: oxygen and hexafluorethane
   Gas Flow: $O_2$=3000 sccm, $C_2F_6$=6 sccm
3. Process Step 2:
   Time: 180 seconds
   Temp.: 250° C.
   Pressure: 1.3 torr
   Power: 900 W
   Gases: oxygen
   Gas Flow: $O_2$=3000 sccm For a fuse clean, the following process may be used:
1. Start:
   Time: 8 seconds
   Temp: 250° C.
   Pressure: 6 torr
   Gases: oxygen
   Gas Flow: $O_2$=5000 sccm
2. Strike:
   Time: 9 seconds idle+3 seconds plasma on
   Temp: 250° C.
   Pressure: 0.8 torr
   Power: 950 W
   Gases: oxygen
   Gas Flow: $O_2$=500 sccm
3. Process:
   Time: 120 seconds plasma on
   Temp: 250° C.
   Pressure: 1.1 torr
   Power: 950 W
   Gases: oxygen, hexafluorethane
   Gas Flow: $O_2$=3000 sccm $C_2F_6$=6 sccm
4. Finish:
   Time: 5 seconds
   Temp: 250° C.
   Pressure: 6 torr
   Gases: oxygen
   Gas Flow: $O_2$=5000 sccm

EXPERIMENTAL RESULTS FOR A VIA DRY CLEAN

The following experiments were carried out to explore the effectiveness of various via cleans. The target via size was 0.22 $\mu$m. The Inter Level Dielectric (ILD) material was High Density Plasma (HDP) deposited oxide. After via pattern and via etch the wafers were split in groups of 4 that received different via cleans.

Split 1 (baseline):
   180 sec process in a Fusion MCU200 asher using 1500W, 1630 sccm O2 and
   270 sccm forming gas at 250° C. and 1 torr;
   15 min treatment in solvent at a wet hood;
   180 sec process at a Fusion MCU200 asher using 1500W, 1630 sccm O2 and 270 sccm forming gas at 250° C. and 1torr;

Split 2 (dry clean for no TiN Undercut Followed by wet Clean):
   180 sec process at a Mattson ASPENII asher using 900W, 3000 sccm O2 at
   250° C. and 1.1torr;
   30 sec treatment at a Mattson ASPENII asher using 875W, 4000 sccm O2 and
   6 sccm C2F6 at room temperature (pins up) and 1.5 torr;
   15 min treatment in IPA (isopropanyl alcohol) at a wet hood;

Split 3 (Dry Clean with Moderate TiN Undercut Followed by Wet Clean):
   180 sec process at a Mattson ASPENII asher using 900W, 3000 sccm O2 at 250° C. and 1.1 torr;

15 sec treatment at a Mattson ASPENII asher using 950W, 3000 sccm O2 and 6 sccm C2F6 at 250° C. and 1.1 torr;

15 min treatment in IPA at a wet hood;

Split 4 (Dry Clean with Moderate TiN Undercut)

180 sec process at a Mattson ASPENII asher using 900W, 3000 sccm O2 at 250° C. and 1.1 torr;

15 sec treatment at a Mattson ASPENII asher using 950W, 3000 sccm O2 and 6 sccm C2F6 at 250° C. and 1.1 torr;

Split 5 (Dry Clean With Extended TiN Undercut)

180 sec process at a Mattson ASPENII asher using 900W, 3000 sccm O2 at 250° C. and 1.1 torr;

30 sec treatment at a Mattson ASPENII asher using 950W, 3000 sccm O2 and 6 sccm C2F6 at 250° C. and 1.1 torr;

Split 6 (Dry Clean to Test Temperature Effect on the no TiN Undercut Process)

180 sec process at a Mattson ASPENII asher using 900W, 3000 sccm O2 at 250° C. and 1.1 torr;

30 sec treatment at a Mattson ASPENII asher using 875W, 4000 sccm O2 and 6 sccm C2F6 at 250° C. and 1.5 torr;

RESULTS

Chains of 170,000 vias of 0.22 $\mu$m diameter were used for yield assessment. Two structures with different overlap of the metal leads to the vias were used:

Chain1 has the following overlap parameters: top end= 0.07 $\mu$m; top side=0.01 $\mu$m; bottom end=0.1 $\mu$m; bottom side=0.03 $\mu$m.

Chain2 has the following overlap parameters: top end= 0.25 $\mu$m; top side=0.25 $\mu$m; bottom end=0.25 $\mu$m; bottom side=0.25 $\mu$m.

Single via Van Der Pauw (VDP) structures with 0.22 $\mu$m diameter vias were also analyzed.

TABLE I

| Via resistance in Ohm per via from lot 9064758. | | | | | | |
|---|---|---|---|---|---|---|
| | Split 1 | Split 2 | Split 3 | Split 4 | Split 5 | Split 6 |
| Avg C1 | 9.907 | 6.218 | 5.957 | 6.3304 | 6.042 | 6.412 |
| Stdev C1 | 1.084 | 0.587 | 0.503 | 0.562 | 0.457 | 0.775 |
| Yield C1 | 97% | 100% | 100% | 100% | 97% | 100% |
| Avg C2 | 11.429 | 6.502 | 6.345 | 6.720 | 6.439 | 6.926 |
| Stdev C2 | 1.486 | 0.526 | 0.472 | 0.458 | 0.400 | 0.801 |
| Yield C2 | 93% | 100% | 97% | 100% | 100% | 97% |
| Avg vdp | 11.356 | 6.294 | 6.263 | 6.577 | 6.177 | 6.453 |
| Stdev vdp | 1.311 | 0.537 | 0.584 | 0.578 | 0.611 | 0.788 |
| Yield vdp | 100 | 100 | 100 | 100 | 100 | 100 |

DISCUSSION

All dry clean splits showed a better electrical performance (lower via resistance, tighter NU and equivalent yield) compared to the solvent clean baseline. If no TiN undercut is wanted, the dry clean process from split 2 is chosen. The other dry clean processes tested allow for the tuning of the TiN undercut to different degrees.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:

providing a semiconductor body forming a resist pattern over said semiconductor body;

removing said resist pattern; and then removing residues remaining after said step of removing the resist pattern from a surface of said semiconductor body using a fluorine source diluted with oxygen in a downstream plasma tool, wherein the fluorine source is diluted to less than 3% by volume.

2. The method of claim 1, wherein said fluorine source comprises $CF_4$.

3. The method of claim 1, wherein said fluorine source comprises $C_2F_6$.

4. The method of claim 1, wherein said fluorine source comprises $SF_6$.

5. The method of claim 1, whrenen said fluorine source comprises $NF_3$.

6. The method of clam 1, wherein said fluorine source comprises $CHF_3$.

7. The method of claim 1, wherein said fluorine source is diluted to less than 1% by volume.

8. The method of claim 1, wherein said removing step uses a pressure in the range of 300 to 2000 mtorr.

9. The method of claim 1, wherein said removing step uses a temperature in the range of 25–350° C.

10. The method of claim 1, wherein said semiconductor body comprises a plurality of vias in the surface thereof and said cleaning step removes a residue from within at least one of said plurality of vias.

11. The method of claim 1, further comprising the step of implanting a portion of said surface exposed by said resist pattern.

12. The method of claim 1, further comprising the step of opening a fuse area at a surface of the semiconductor body after the step of forming a resist pattern.

13. The method of claim 1, further comprising the step of forming a photoresist layer on said surface of said semiconductor body after said removing residues step, wherein said removing residues step conditions said surface to improve adhesion of said photoresist layer.

14. The method of claim 1, further comprising the step of forming scribe numbers in said surface, wherein said removing residues step removes a residue from within said scribe numbers.

15. The method of claim 1, wherein said fluorine source in oxygen is additionally diluted with a gas selected from the group consisting of hydrogen, helium, nitrogen, argon, and combinations thereof.

16. A method of fabricating an integrated circuit, comprising the steps of:

providing a semiconductor body having an oxide layer at a surface thereof;

patterning said oxide layer with a resist pattern;

etching said oxide layer;

ashing the resist pattern; and after the resist pattern is removed, performing a post oxide etch removal process to remove residue from a surface of said semiconductor body using a fluorine source diluted with oxygen in a downstream plasmas tool, wherein the fluorine source is diluted to less than 3% by volume.

17. A method of fabricating an integrated circuit, comprising the steps of:

providing a semiconductor body;

forming an interlevel dielectric over said semiconductor body;

forming a resist pattern over said interlevel dieletric;

etching said interlevel dielectric using said resist pattern;

removing said resist pattern, wherein said etching and removing steps leave residues; and removing said residues using a fluorine source diluted with oxygen in a downstream plasma tool, wherein the fluorine source is diluted to less than 3% by volume.

18. A method of fabricating an integrated circuit, comprising the steps of:

providing a semiconductor body having an HSQ (hydrogen silesquioxane) layer at a surface thereof;

patterning said HSQ layer with a resist pattern;

etching said HSQ layer;

ashing the resist pattern; and performing a post HSQ etch removal process to remove residues from a surface of said semiconductor body using a fluorine source diluted with oxygen in a downstream plasma tool, wherein the fluorine source is diluted to less than 3% by volume.

* * * * *